US008580674B2

(12) United States Patent  
Simmons et al.

(10) Patent No.: US 8,580,674 B2  
(45) Date of Patent: Nov. 12, 2013

(54) FABRICATION OF ATOMIC SCALE DEVICES

(75) Inventors: Michelle Yvonne Simmons, Maroubra (AU); Andreas Fuhrer, Zurich (CH); Martin Fuechsle, Deuerling (DE); Bent Weber, Mosman (AU); Thilo Curd Gerhard Reusch, Regensburg (DE); Wilson Pok, Lakemba (AU); Frank Ruess, Herrenberg (DE)

(73) Assignee: Qucor Pty Ltd, Sydney, New South Wales (AU)

( * ) Notice: Subject to any disclaimer, the term of this patent is extended or adjusted under 35 U.S.C. 154(b) by 260 days.

(21) Appl. No.: 12/866,324

(22) PCT Filed: Dec. 9, 2008

(86) PCT No.: PCT/AU2008/001814  
§ 371 (c)(1),  
(2), (4) Date: Feb. 10, 2011

(87) PCT Pub. No.: WO2009/097643  
PCT Pub. Date: Aug. 13, 2009

(65) Prior Publication Data  
US 2011/0121446 A1    May 26, 2011

(30) Foreign Application Priority Data

Feb. 5, 2008   (AU) ................................ 2008900526

(51) Int. Cl.  
*H01L 21/4763*   (2006.01)
(52) U.S. Cl.  
USPC .............................................. 438/618; 438/5
(58) Field of Classification Search  
USPC .................................................... 438/618, 5  
See application file for complete search history.

(56) References Cited

U.S. PATENT DOCUMENTS

2006/0275958 A1* 12/2006 Ruess et al. ................... 438/149

OTHER PUBLICATIONS

Buzzo, "Two-dimensional dopant imaging of silicon carbide devices by secondary electron potential contrast", Science Direct, pp. 413-418, Microelectronic Eng. 84 (2007).  
Elliott, "Dopant profiling with the scanning electron microscope", vol. 91, No. 11, pp. 9116-9122, Journal of Applied Physics, Jun. 2002.  
Gomati, "Why is it possible to detect doped regions of semiconductors in low voltage SEM: a review and update", Surface and Interface Analyses 2005, pp. 901-911.  
Kazemian, "Site-specific dopant profiling in a scanning electron microscope using focused ion beam prepared specimens", Applied Physics Letters 88, pp. 212110-212110-3.  
Voyles, "Depth-Dependent Imaging of Individual Dopant Atoms in Silicon", Microsc. Microanal. 10, pp. 291-300, 2004.

* cited by examiner

*Primary Examiner* — Douglas Menz  
(74) *Attorney, Agent, or Firm* — Wood, Phillips, Katz, Clark & Mortimer

(57) ABSTRACT

This invention concerns the fabrication of nano to atomic scale devices, that is electronic devices fabricated down to atomic accuracy. The fabrication process uses either an SEM or a STM tip to pattern regions on a semiconductor substrate. Then, forming electrically active parts of the device at those regions. Encapsulating the formed device. Using a SEM or optical microscope to align locations for electrically conducting elements on the surface of the encapsulating semiconductor with respective active parts of the device encapsulated below the surface. Forming electrically conducting elements on the surface at the aligned locations. And, electrically connecting electrically conducting elements on the surface with aligned parts of the device encapsulated below the surface to allow electrical connectivity and tunability of the device. In further aspects the invention concerns the devices themselves.

22 Claims, 11 Drawing Sheets

FABRICATION OF ATOMIC SCALE DEVICES

TECHNICAL FIELD

This invention concerns the fabrication of atomic scale devices, that is electronic devices fabricated to atomic accuracy. In a further aspect the invention concerns the devices themselves.

BACKGROUND ART

Electron Beam Lithography (EBL) is a popular technique for patterning electronic devices using electron beams. The Scanning Electron Microscope (SEM) is the main tool used in industrial dopant profiling applications. SEM has been used to image doping layer superlattices, pn-junctions as well as MOSFETs.

The Scanning Tunnelling Microscope (STM) operates in an Ultrahigh Vacuum (UHV) and is therefore not so suitable for industrial scale operations. However the STM can not only image down to the atomic scale, but has also been used to manipulate matter at the atomic scale. For instance, it is possible to use a STM to pattern individual phosphorus donors in silicon with atomic precision.

The Atomic Force Microscope (AFM) is, relevantly, a different type of STM used for imaging, measuring and manipulating matter at the nanosccale. In this specification STM and AFM can be used interchangeably.

For a fully operational device, it is necessary to connect macroscopic leads to the atomic-scale device, made using the STM, after it has been removed from the UHV environment; that is "ex situ". Many across the world have tried to develop a functional registration process for making accurate macroscopic electrical contacts and control gate electrodes on top of individual buried STM fabricated structures.

The applicant's earlier patent application, PCT/AU2004/001118, describes a method for fabricating atomic scale devices, comprising the steps of:

Creating one or more visible registration markers on a clean silicon surface.

Using a SEM to form an image of at least one of the registration markers and the tip of a STM in the vicinity of the registration marker.

Using the image to position and reposition the STM tip relative to the marker with nanometer or micron resolution in order to pattern the active region of the device structure on the silicon surface.

Forming the device on the surface and then encapsulating it with silicon such that one or more of the registration markers are still visible on the silicon surface ex situ to a SEM.

Depositing a metal layer onto the silicon surface using either optical or electron beam lithography to form one or more macroscopic ohmic or gate electrodes, at one or more locations positioned relative to the visible registration markers.

Devices fabricated by this technique can be imaged by cleaving or FIB milling of the substrate, and subsequent imaging of the cross-section (the dopants are thus on the surface). The imaging contrast is attributed to electrostatic surface effects caused by the different ionisation energies within the doped regions. They can also be imaged in-situ by the STM tip after a few layers of silicon atoms have been laid down to encapsulate the electrically active dopants; this is done to ensure the dopants have remained in place and not moved.

Electrical characterization of atomic-scale devices patterned in (UHV) requires alignment of ex situ macroscopic contacts to the buried device layers after the samples are removed from the UHV environment.

Prepatterning the initial Si substrate with the registration markers provides a structure that can be used to align the ex situ contacts. However, the high temperature anneal (~1100° C.) required to prepare atomically flat Si surfaces in UHV for STM imaging places severe constraints on the potential types of markers used. Also, any deterioration of surface quality in the device region due to surface contamination can limit the practical use of the registration markers.

Nevertheless, registration markers that were etched into the Si substrate before the STM lithography step to a depth of 300 nm, have been found to survive all necessary chemical cleaning and high temperature steps so that they can be imaged by an optical microscope after device patterning and growth, giving alignment accuracies of 500 nm.

However, the long term ability to align multiple gates and Ohmic contacts to buried STM-patterned dopants requires much higher alignment accuracies and has remained a key challenge for more complex, gated nano- and atomic-scale devices.

DISCLOSURE OF THE INVENTION

The invention is a method for fabricating atomic scale multi-terminal electronic devices, comprising the steps of:

Opening one or more regions of a mask on a semiconductor surface using either a scanning tunnelling microscope (STM) tip capable of atomic precision or a scanning electron microscope (SEM) capable of micro-nano precision.

Treating the regions to form coplanar components of the device on the semiconductor surface.

Encapsulating the components of the device with more of the semiconductor.

Using an optical or electron microscope to identify locations on the surface of the encapsulated device that are above selected components of the device encapsulated below the surface.

Forming conducting elements on the surface of the encapsulated device at the identified locations. And, Electrically connecting conducting elements on the surface of the encapsulated device with aligned components of the device encapsulated below the surface.

This invention has addressed the difficulty of aligning surface conducting elements, to buried atomic scale devices. The invention uses either the SEM or the STM tip to pattern the regions of the device that will become electrically active, including contact and gate components. The device components are then formed by either deposition of dopant containing precursors, metals, magnetic materials or organic material onto the patterned regions, and the device is subsequently encapsulated. In some instances the components of the device only become electrically active during encapsulation. The alignment problem is therefore reduced to aligning surface conducting elements locations to buried contacts and gate components which are typically much larger than the functional components of the device.

Maintaining atomic precision throughout the entire pattern may be achieved, for instance, by patterning the entire pattern in one operation of the STM tip; that is using a single continuous program to control the entire operation. However, it is also possible to interrupt the operation and restart it in the appropriate place, for instance using the techniques described in PCT/AU2004/001118.

The invention then captures images that indicate edges of the STM-patterned regions of the device encapsulated below the surface ex-situ using either an optical or electron microscope, particularly a SEM. This enables the alignment accuracy between the encapsulated regions and surface contacts or gates to be improved down to 50 nm.

The technique involves the encapsulation process, and in particular encapsulation of the device with silicon to a thickness where at least some of the edges of the regions of the device are visible ex situ using a SEM or optical microscope.

The ability to image the encapsulated device structure ex-situ using SEM or optical microscopy is surprising and unexpected. It is assumed that the contrast seen by the SEM or optical microscope between conducting and insulating regions is due to a different surface roughness of the Si encapsulation layer over conducting regions and the bulk Si(100) substrate. Several findings from SEM and STM imaging of the buried devices support this hypothesis.

The deposition of a surface electrical conducting layer onto the encapsulating silicon surface above the plane can then be directed to locations relative to the visible edges of the gate regions under supervision using SEM or optical techniques.

Another technique that works well with the SEM imaging builds on the earlier work of PCT/AU2004/001118 and involves prepatterning the silicon substrate, for instance with an EBL-defined, wet-etched ring boundary which leaves a formation visible to STM (and AFM) after encapsulation.

A ring boundary may encircle an area of the clean silicon surface, and when appropriate step engineering techniques are employed it is possible to create a step-free, that is atomically flat, plane within the boundary. This assists with alignment of the surface ohmic locations to the buried non-active regions. A particularly useful arrangement employs a circular trench boundary between 50 nm and 200 nm deep around an atomically flat plane up to microns in diameter. Atomically flat planes of several hundred nm are big enough to fabricate entire active regions of nanostructure devices as well as at least part of each gate. The remaining parts of each gate may extend down from the plane into the trench.

Additional micron sized markers may also be prepatterned onto the silicon to aid with aligning the ohmic surface locations which are EBL-patterned on top of the encapsulation. STM or AFM can be used to check alignment accuracy.

Using these or other techniques the invention is able to produce highly planar devices, that is having both the active and gate or contact regions patterned on either a stepped silicon surface or on one atomic plane.

In any event, the entire fabrication process is able to be conducted using a combination of STM and/or electron beam lithography (EBL). As a result, the process may allow the fabrication of multiple marker structures either several hundred nm in depth, or shallower ~100 nm deep markers that can be imaged by the STM directly. These techniques in combination with ex-situ imaging using a SEM or optical microscope are also able to increase overall alignment accuracies down to 50 nm.

The resulting devices may comprise a single layer of STM-patterned δ-doped phosphorus-doped silicon (100), where the pattern has atomic precision throughout. The device may be overgrown with an epitaxial silicon layer which creates crystalline silicon above the device. An encapsulation thickness of approximately 25 nm has been found to be transparent to SEM. The parameters of the silicon crystal overgrowth layer may contribute to the visibility of the encapsulated device ex-situ using SEM. It should be appreciated that this imaging of the buried dopants by SEM does not require removal of the encapsulation layer, and is non-destructive.

The crystalline silicon crystal growth may also contribute to the ability of very small doped structures in the device to conduct. For instance, gates and leads comprising phosphorus doped silicon and sized down to below 2 nm wide have been found to conduct in such devices.

The active parts of the devices will typically comprise planar, doped active (electrically addressable) nanostructures in silicon. This nanostructure may comprise active regions that form conductive leads and gates required by the devices.

Surface gates and ohmic contacts may be fabricated using SEM and EBL techniques This is expected to significantly increase yield.

Electrical contact between encapsulated active regions, and surface conductive elements may be achieved, using either optical, SEM and/or EBL techniques, by etching an array of small holes, say between 10 and 500 nm in diameter, through the encapsulation layer down to, at least, the device layer. Subsequent metallisation of contacts over these holes will then make a good electrical contact. This is expected to increase the yield of electrically contacted devices from ~10% to ~70%. This process has the added benefit of negating the need for an ex-situ ohmic contact metallisation anneal. Therefore in addition to forming reliable contacts it also minimises thermal budget during device fabrication and therefore diffusion of species out of the STM patterned regions.

The entire buried dopant structure may be imaged and recorded using an SEM to generate pattern files for SEM control software to create greater alignment of EBL defined contacts to the buried dopants. This eliminates the stringent need for registration markers and allows for much higher alignment and overlay accuracies for ex-situ processing such as patterning of ohmic contacts and top-gates.

The entire buried dopant structure may be cloned in multiple instances either laterally or in multiple vertical layers using control software. The clones may be located next to each other with a pitch of down to 20 nm.

The step of using an STM tip to pattern doping regions on a clean silicon surface may be with respect to registration markers on the surface, either in a single patterning step or in several steps where subsequent patterns are aligned using STM imaging between the patterning steps.

It is also possible to build a second such device on top of the first, that is on top of the encapsulating layer of silicon. Alternatively a different device may be fabricated on top of the first. Multilayer devices may be fabricated in this manner.

In a second aspect the invention is an atomic scale multi-terminal device, comprising:

Coplanar electrically active components defined with atomic precision on a semiconductor substrate, encapsulated with more semiconductor. Having electrically conducting elements on the encapsulating semiconductor surface aligned with respective electrically active components encapsulated below the surface. And, having electrical connections between the electrical conducting elements on the semiconductor surface and aligned electrically active components encapsulated below the surface. The encapsulated electrically active components of the device may include ohmic contacts or gates, or both.

In a third aspect the invention is an atomic scale multi-terminal device, wherein at least some of the electrically active components of the device are defined with atomic precision on a single atomic plane on a silicon substrate, and encapsulated with epitaxial silicon.

BRIEF DESCRIPTION OF THE DRAWINGS

An example of the invention will now be described with reference to the accompanying drawings, in which:

FIGS. 1(a) and (b) illustrate before and after etching a registration marker array.

FIG. 1(o) is a SEM image of the final nanowire device showing alignment of contacts to the circular terrace, and the buried pattern layer.

FIG. 2(a) is a STM image (z derivative) of the device region.

FIG. 2(b) is an AFM image of the same area after encapsulation.

FIG. 2(c) is a composite image of a contacted device showing all STM scan frames acquired during lithography, stitched together.

FIG. 3(a) is an STM image of the wire patterned on the central step-free terrace.

FIG. 3(b) is the dc I-V characteristics of the device at 4.2 K for different gate voltages.

BEST MODES OF THE INVENTION

Low Temperature Preparation

Figure 1:
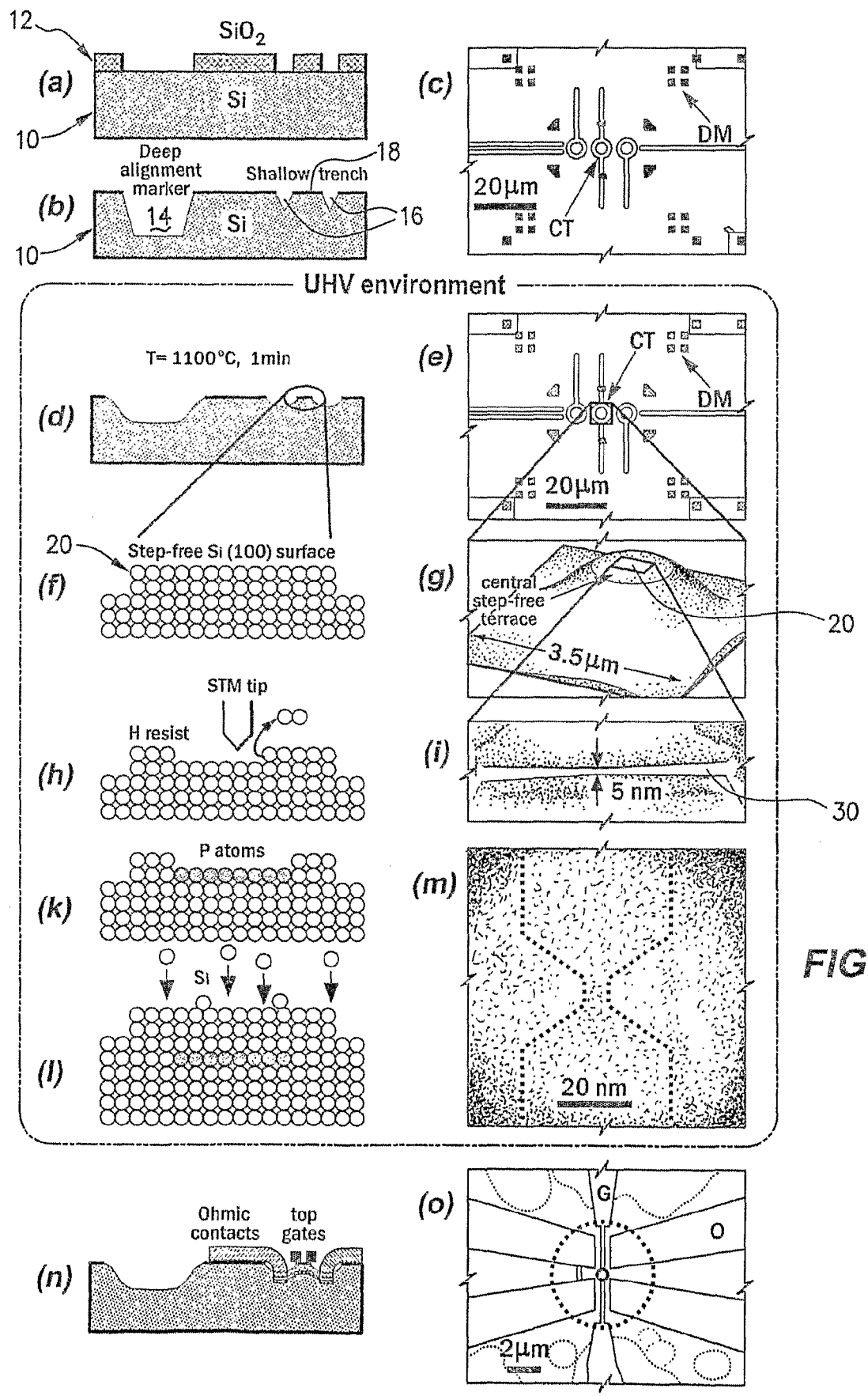
FIGS. 1(a) to (o) is a series of drawings and images giving a schematic overview of the fabrication scheme. In particular.
FIG. 1(c) is a SEM image of the initial marker array.
FIG. 1(d) illustrates the effect of a 1100° C. anneal on the marker structures.
FIG. 1(e) is a STM images showing the effect of the 1100° C. anneal on the marker structures.
FIG. 1(f) illustrates a step-free Si (100) surface.
FIG. 1(g) is a Three-dimensional STM image of the step-free surface.
FIG. 1(h) illustrates desorbing atomic hydrogen to form a H resist.
FIG. 1(i) is a STM image of a tapered wire patterned in the resist.
FIG. 1(k) illustrates incorporation of P dopant atoms.
FIG. 1(l) illustrates device encapsulation with epitaxial Si.
FIG. 1(m) is a STM image of an encapsulated device.
FIG. 1(n) illustrates Ex situ alignment of Ohmic contacts and top gates.

Referring first to FIG. 1(a) a n-type phosphorus-doped 2 inch. Si(100) wafer 10 with a miscut angle of ±0.1° and a bulk resistivity of 1-10 Ohmcm. After an initial wet-chemical cleaning procedure in sulphuric peroxide 3:1 $H_2SO_4$:$H_2O_2$, 5% HF, and 6:1:1 $H_2O$:HCl:$H_2O_2$, a 50 nm thermal dry oxide layer 12 is grown onto the wafer substrate at 1100° C. This $SiO_2$ layer protects the Si surface from possible contamination during the subsequent processing steps and acts as a lithographic mask for the marker structures.

In particular a hierarchical array of registration markers is defined in the oxide layer by e-beam lithography on a suitable EBL system using standard polymethyl methacrylate resist. The array comprises two types of markers that serve different purposes and are accordingly patterned in two subsequent EBL/wet-etching cycles with different etch depths:

The outer, deeper structures (50 μm$^2$ squares), one of which is indicated at 14, serve solely as alignment markers and are used for both coarse alignment of the STM tip inside the UHV chamber with an optical microscope as well as for fine alignment (using 2×2 arrays of 2 μm$^2$ squares) during the EBL-processing steps after the sample is taken out of the UHV system.

The inner circular markers (5.1 μm diameter) 16 are used to form a step-free Si(100) plateau 18 exactly at the centre of the marker array that defines the central device region for high resolution STM lithography. These markers are also shallow enough to allow imaging with the STM, thereby providing extra alignment capability.

FIG. 1(c) shows a SEM image of a registration marker sample before the high temperature anneal in UHV (flashing) with the deeper 2×2 square array markers 14 (DM) and the shallow circular trenches 16 (CT) at the center of the marker array (the outermost optical markers are not shown).

Pattern transfer[3] is achieved by etching the $SiO_2$ mask in buffered HF 15:1 $NH_4F$:HF at 30° C., followed by a wet chemical etch of the exposed Si substrate in a 25% aqueous tetramethyl ammonium hydroxide solution at room temperature[15], see FIG. 1(b). The deep markers 14 defined in the first EBL step are etched to a depth of 400 nm to ensure good contrast in the SEM after flashing. The shallow markers 16 are defined in a second EBL step and are aligned to the deep markers. The shallow markers 16 are etched to 100 nm in depth.

After wet etching of the marker array, the protective oxide layer 12 is removed in a buffered HF etch followed by a final full cleaning cycle similar to the initial wafer clean to remove organic and metallic residues.

Anneal

The samples are then introduced into a UHV-STM system equipped with a Si sublimation cell with typical base pressures of <1×10$^{-11}$ mbar. After outgassing the sample for several hours at ~450° C. using a resistive heater, the sample is direct current heated to 1100° C. for 1 min to remove the native oxide layer as well as residual traces of carbon. The anneal also forms the Si(100) 2×1 surface reconstruction. Due to surface silicon diffusion during the anneal, the integrity of the etched alignment markers degrades, and their initially sharp edges become rounded as the etch pits fill up as a result of silicon migration. The deep markers decrease to ~120 nm in depth during flashing, in agreement with previous observations[3,16] while the shallow markers reduce to ~60 nm in depth. FIG. 1(e) shows a SEM image of a marker sample after the 1100° C. annealing step and encapsulation in ~25 nm epitaxial Si. The rounding of the marker structure is clearly visible.

Formation of Central Step-Free Terrace

The formation of a large step-free plateau 20 exactly at the origin of the registration marker array is extremely important to our alignment strategy.

The exact nature of the kinetic processes that cause the surface morphology of Si substrates to change and lead to the formation of large step-free areas on Si(100) and Si(111) during high temperature annealing is still a matter of debate.[12] It is understood that high temperature annealing causes the movement of atomic steps across terraces by a step-flow evaporation process. The steps eventually accumulate at barriers such as micron-sized periodic gratings[12] or ridge structures[9,10] or, in our case, etched circular trenches, which leads to step-free regions between the barriers.

At high enough temperatures atoms at step edges may detach from the steps, diffuse on to the terraces as adatoms, and eventually desorb into the vapor.[7] If the adatoms are predominantly derived from the steps some adatom-vacancy pairs will also form on terraces, the rate of evaporation on a large terrace, per bounding step-edge site, will be larger than on a small terrace, which causes widely spaced steps to move faster than narrowly spaced ones. Since regions of high step density such as the sidewalls of etched trenches represent a barrier for step flow, a large terrace will form on an area enclosed by a trench once it has been cleared from all steps by step flow to the barriers; see FIGS. 1(f) and 1(g).

At the same time, due to surface diffusion, the trenches fill up with silicon and their edges become rounded. This degradation of integrity of etched structures depends on their width and depth[16] (which in our case are not independent parameters due to the anisotropy of the etch process). We found that the smallest 400 nm deep periodic grating features that can still be resolved in the SEM after the annealing step have a pitch of ~1.5 µm.

We have tested several different shapes of the central shallow marker structures for their ability to create step-free areas, such as parallel lines, dot arrays, and circular trenches of different diameters. While all types of etched structures generally resulted in the formation of some step-free areas during flashing, only the enclosed circular trenches were found to be useful for our registration purposes, since they reliably provided step-free terraces at a predictable position, in this case, exactly in the center of the circular trench.

In our case, we determined that the optimal diameter of these circular trenches is 5.1 µm with a trench width of ~1 µm.

For smaller diameters, no large terraces formed as the hillock enclosed by the circular trench did not extend to its full height after the anneal, while for larger diameters, pits were found to form in the middle of the terrace. The formation of pits has been previously observed[10,11] and was attributed to large step-free terraces eventually becoming unstable against the formation of vacancy clusters at some distance from the step edges when the terrace width exceeds the average adatom diffusion length before desorption.

We have also investigated how the terrace width changes with the etch depth of the shallow circular trench and have found that an initial depth before flashing of approximately 100 nm yields the largest step-free areas. It should also be mentioned that we are limited in varying the depth by the practicability of scanning these regions during STM lithography. If the trench is too deep (>200 nm before flashing), the high surface corrugation on the slope of the hillock causes an advanced decay of the STM tip and makes aligning the contact patches difficult as the visibility of the desorbed regions decreases for higher step density. If the trench is too shallow (<50 nm) before flashing, it becomes very difficult to locate the position of the central terrace due to the low surface corrugation after flashing (<10 nm).

We have optimized a method of achieving atomically flat circular trenches that can be imaged and lithographically patterned by the STM. Typically, the largest terraces created by our method have measured up to microns across; however, we are able to reliably achieve step-free regions with several hundreds of nanometers in diameter so that the active regions of our nano- to atomic-scale devices can be patterned on a single atomic plane.

Device Fabrication

After annealing the silicon surface at ~1100° C. for 1 min to achieve the atomically reconstructed Si(100) 2×1 surface, the Si is then terminated with atomic hydrogen using a thermal cracker source which forms a monohydride resist for STM lithography[1], see FIG. 1(h).

Figure 2:
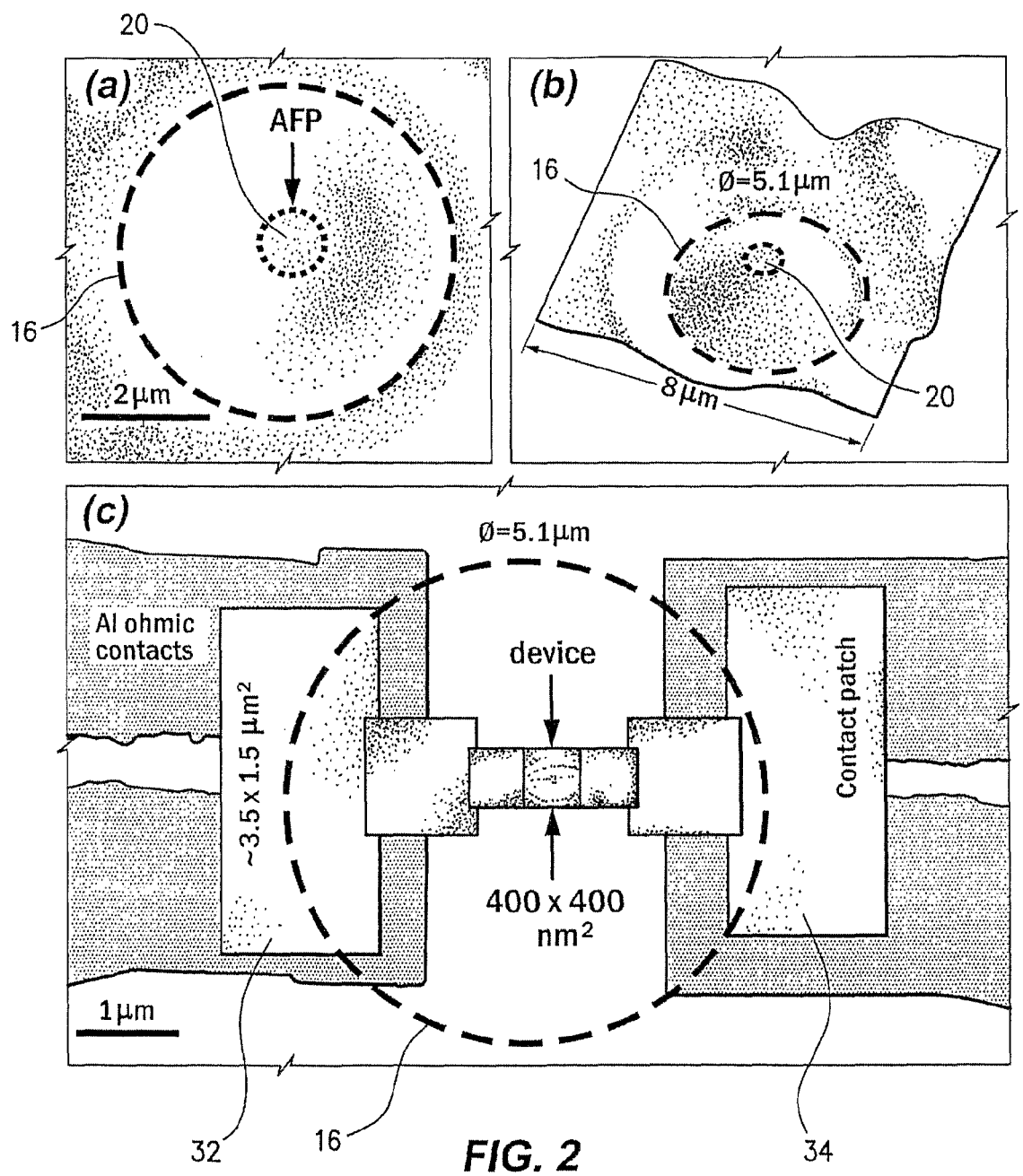
FIG. 2 is a series of STM image (z derivative) taken under constant current conditions Vb=−2 V, I=0.1 nA of a central device region.

Beginning with micron sized scan frames, see FIG. 2(a), the central terrace 20 is then located using the STM in imaging mode typical sample bias Vb=−2 V and tunneling current I=0.1 nA. The dotted white circle indicates the position of the central atomically flat plateau 20 (AFP) enclosed by the circular trench 16 (dashed white line).

Selective desorption of the H resist to form the device pattern required is then performed using the STM tip with Vb=+7 V and I=3 nA. The active region of our devices such as nanowires,[6] dot arrays,[7] tunneling gaps,[8] and nanodots[4] can usually be patterned within a 400×400 nm² STM scan frame and, thus, fits on the central step-free terrace. FIG. 1(i) shows as an example a tapered wire device 30 down to ~5 nm thickness, that has been STM patterned on a ~300 nm wide terrace. To aid the formation of ohmic contacts to such a STM-patterned device, large square contact regions 32 and 34 up to approximately 3.5×1.5 µm² in size are consecutively patterned by the STM, aligned either side of the circular trench 16, and desorbed, as illustrated in the composite STM and SEM image of a final device in FIG. 2(c).

FIG. 2(c) is a composite image of a contacted device showing all STM scan frames acquired during lithography, stitched together with the central terrace 20 patterned within a 400×400 nm² scan frame and three consecutive contact patches on either side 400×400 nm², 800×800 nm², and 3.5×1.5 µm², respectively. The trench dashed white line 16 is clearly visible in the STM images of the big contact patches and serves to align the four-terminal ohmic contacts SEM image in the background.

The circular trench 16 is clearly visible in both the STM images, see FIG. 2(c) acquired during lithography as well as ex situ with AFM, see FIG. 2(b). As a result the onset of the trench 16 serves to check the alignment of the EBL defined ohmic contacts before metallization with an accuracy of ~100 nm. In addition, being able to image the encapsulated donors directly with the SEM during ex-situ processing allows for alignment accuracies down to the <50 nm level.

Phosphine ($PH_3$) molecules selectively adsorb onto the desorbed regions. A subsequent 1 min anneal at 350° C. incorporates 17 P dopant atoms from the $PH_3$ precursor molecules into the Si surface, as depicted in FIG. 1(k). We have previously demonstrated atomic-precision P incorporation at specific sites on the Si surface.[17] A silicon sublimation cell is used to grow a 25 nm epitaxial Si encapsulation layer at 250° C. over the entire device, see FIG. 1(l), to maintain the structural integrity of the Si:P devices by minimizing the possibility of dopant diffusion out of the STM-patterned area.[18] This also ensures full electrical activation of the P donors yielding a carrier density of ~$1 \times 10^{14}$ $cm^{-2}$.[5]

After Si encapsulation, the sample is taken out of the UHV system, and ohmic contacts are EBL-patterned onto the substrate, using the micron-sized etched square arrays, see 14 (DM) in FIG. 1(c), as markers to align to the STM-patterned device with an accuracy of 100 nm. Higher accuracies can be accomplished by imaging the encapsulated device directly with an SEM as described below. At the same time, standard cross-shaped markers are patterned which serve as alignment markers in subsequent EBL steps. AFM is used to check the alignment accuracy of the ohmic contacts before metallization, which is possible since the circular trench as well as the 60 nm high hillock in its center are visible in the AFM, as shown in FIG. 2(b). The atomically flat, central terrace at the top of the hillock cannot be resolved with AFM, and we therefore estimate the precision of this AFM alignment check, using the circular trench, to be 100 nm, which is comparable to the accuracy of the EBL step.

After metallization of the ohmic contacts, electrical contact to the buried P-doped region is established by a 30 min contact anneal at 350° C. Top gate structures are written in a subsequent EBL step, with alignment occurring to the well-defined metallic marker crosses. The alignment accuracy of these gated structures, which is of central importance to the successful fabrication of nanoscale devices, is thus limited by the accuracy of the penultimate EBL step.

In a final step, the sample is cleaved, glued into a standard chip package and bonded using an Al wedge bonder. It should be emphasized that, while STM lithography can be performed with atomic precision, the ex situ alignment of external ohmic contacts and gates to the encapsulated device represents a critical step in our alignment strategy due to the thermal degradation of the marker structures. We estimate the overall alignment accuracy to be 100 nm, which corresponds to the measurement uncertainty when using AFM to verify the correct alignment of the EBL-patterned ohmic contacts with respect to the circular trench. More recent advances, where the SEM imaging can be used to image the buried donors and align directly to this image have increased alignment accuracies below ~50 nm.

More recent results have proved that the circular markers are not necessary since the device can be imaged with SEM after removal from UHV. Furthermore, the contacts no longer need to be annealed to 350° C. Etching small holes down to the device plane and metallisation alone gives good enough electrical contact to the device.

Si:P Nanowire Device

Using the technique described above, we have patterned a $50 \times 240$ $nm^2$ nanowire device on the central terrace of a registration marker array. FIG. 3(a) shows a STM image of the device before $PH_3$ dosing. The H-desorbed regions appear brighter due to an additional tunnelling current from the Si surface states. The step-free terrace is clearly visible and has a diameter of approximately 280 nm. After encapsulation with a ~25 nm epitaxial Si layer, four terminal Al ohmic contacts were EBL patterned, using the 2×2 array of 2 $\mu m^2$ squares shown in FIGS. 1(c) and 1(e) as alignment markers. To investigate possible conductance modulation, an Al top gate (230 nm width) was patterned over the nanowire in a subsequent EBL step, using the native $SiO_2$ layer as a barrier. FIG. 1(o) shows an SEM image of the final device.

The device was measured at 4.2 K using standard dc and lock-in techniques. The wire shows comparatively low contact resistances <1 kOhm for all contacts which can be attributed to the good alignment accuracy achieved using EBL markers. From comparing SEM images of the final device after metallization to STM images acquired during H lithography of the contact patches, we estimate an overlap area between metallic leads and P-doped regions of approximately 2-3 $\mu m^2$. FIG. 3(b) shows the dc I-V characteristics of the wire at 4.2 K for three different gate voltages Vg=0, ±400 mV. Carriers in the nondegenerate n-type Si substrate are frozen out at this temperature, so electron conduction is entirely confined to the P-donor nanowire. The device shows ohmic behavior with a resistance of 4.9 kOhms.

Previous STM studies of our group[18] estimate the effective thickness of the initially planar Si:P devices to be ~6 Å due to P segregation during Si overgrowth at 250° C. Using this value and the lateral dimensions of the wire, we obtain a resistivity of ~$6 \times 10^{-7}$ Ohm cm, comparable with devices of similar dimensions.[6] Even though a surface gate has been patterned on the native oxide layer, no gating effect could be observed within the voltage range before leakage (approximately ±400 mV). It is likely that we do not have a large enough gate voltage range to cause gating action and future work will incorporate a thick, low temperature UHV oxide on top of the STM-patterned and encapsulated structures to gate these devices.

Figure 3:
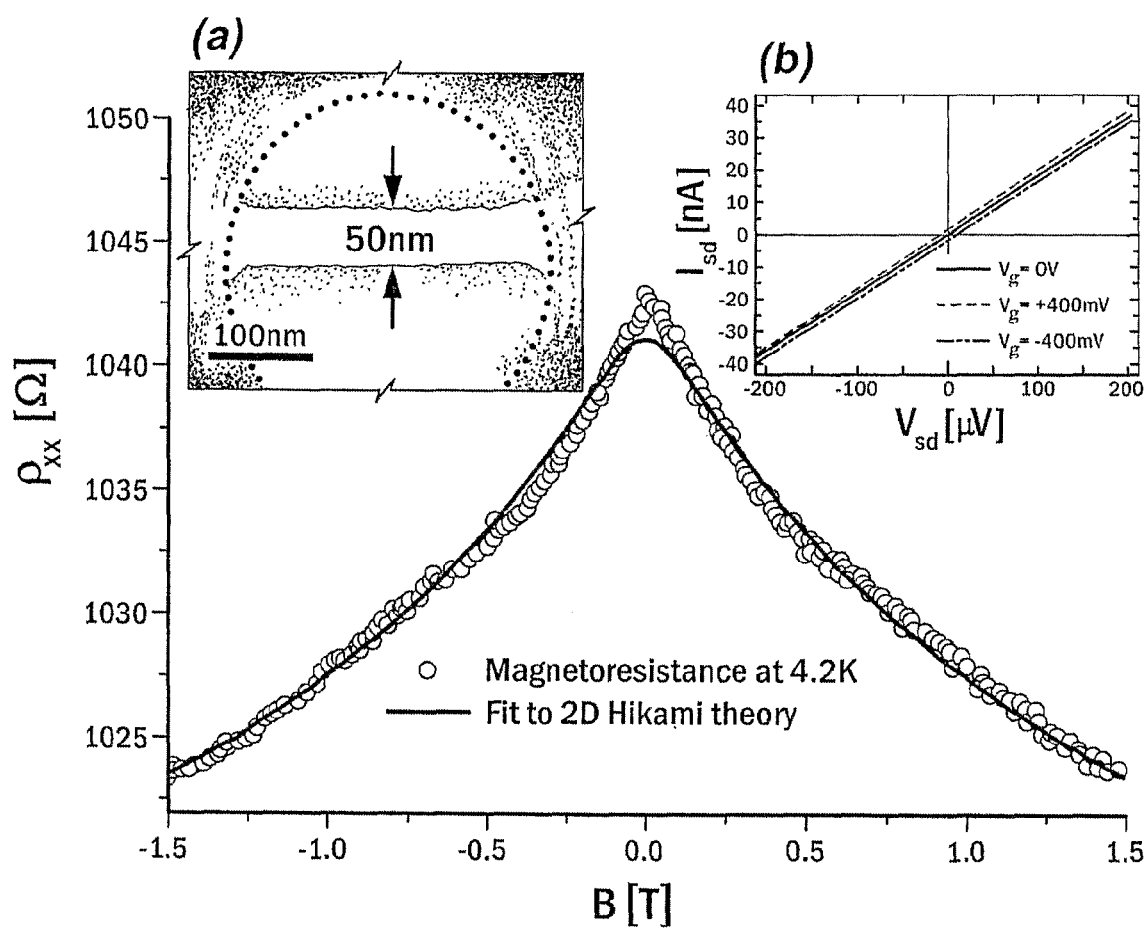
FIG. 3 is a graph showing the magnetoresistance curve of a 50×240 nm$^2$ wire at 4.2 K. The solid curve represents a fit to Hikami 2D weak localization theory.

Three-terminal constant current magnetoresistance traces were measured in a perpendicular magnetic field from −1.5 to 1.5 T at 4.2 K. A negative magnetoresistance peak is observed as a result of weak localization of the carriers in the highly diffusive, metallic Si:P system.[19] FIG. 3 shows the measurement data at 4.2 K along with a fit to two-dimensional 2D weak localization theory using the Hikami formula.20 From the Hikami model, we extract a phase coherence length of ~47 nm, which approximately corresponds to the width of the wire. This result is consistent with more recent results of Si:P nanowires,[6] where, as the wire width is decreased to below the phase coherence length, a crossover between one-dimensional and 2D weak localization is observed.

Quantum Dot Device

Figure 4:
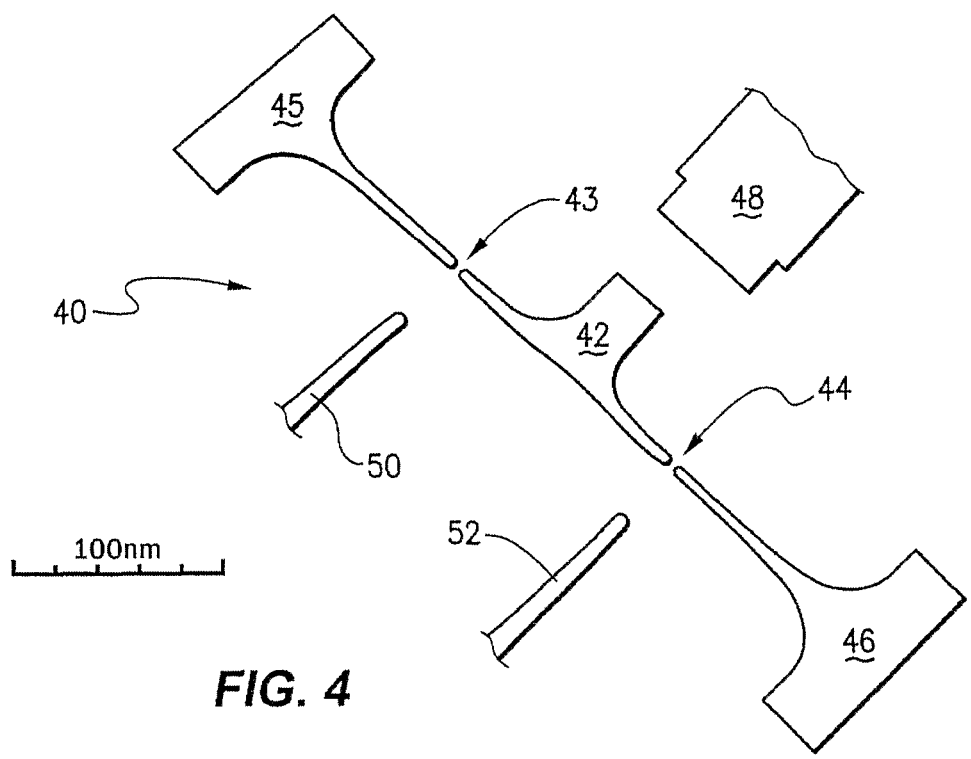
FIG. 4 is a plan view of a quantum dot device.

A more complex quantum dot device 40 will now be described with reference to FIG. 4. In this device a quantum dot 42 is formed by an island of phosphorus doped silicon. The dot 42 is separated from the phosphorus doped source 45 and drain 46 regions by two gaps 43 and 44 where small sections of intrinsic silicon form two tunnelling junctions. Three phosphorus regions 48, 50 and 52 in the same plane as the dot 42 but running perpendicular to the axis of the dot 42 are used as gates to tune the conduction from source 45 to drain 46 in what is referred to as a single electron transistor or quantum dot. The two lower gates 50 and 52 predominantly control conduction across the respective tunnelling barriers 43 and 44, while the plunger gate 48 tunes the electron density on the dot 42.

Figure 5:
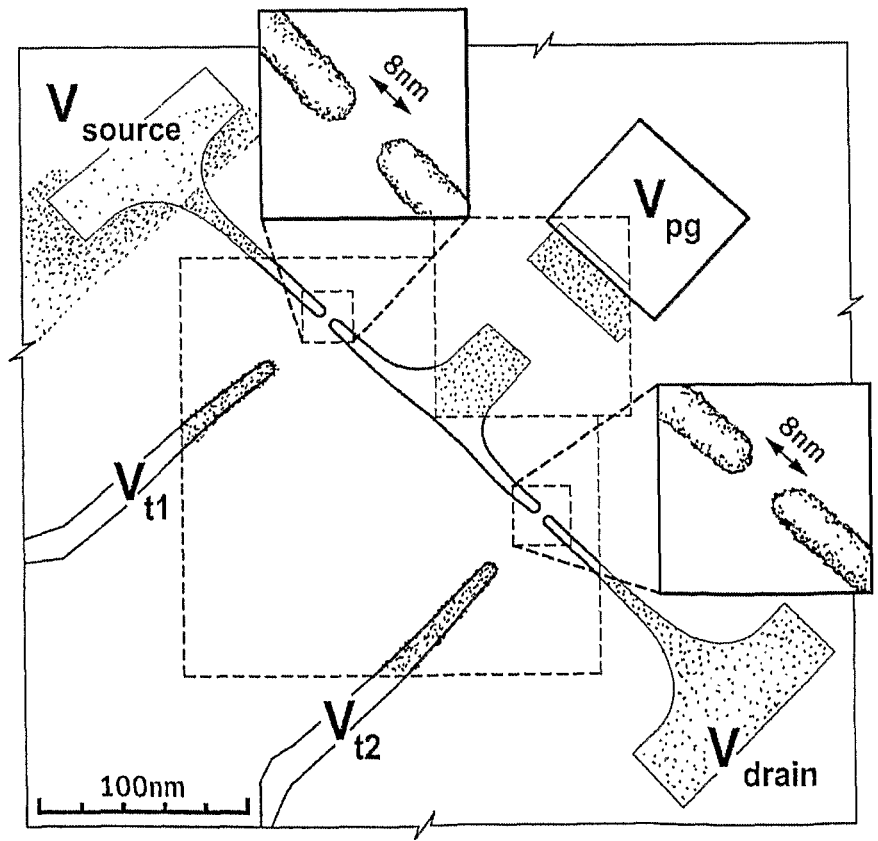
FIG. 5 is a plan view of the device of FIG. 4 with the insets showing the atomic resolution of the tunnel barrier regions.
Figure 6:
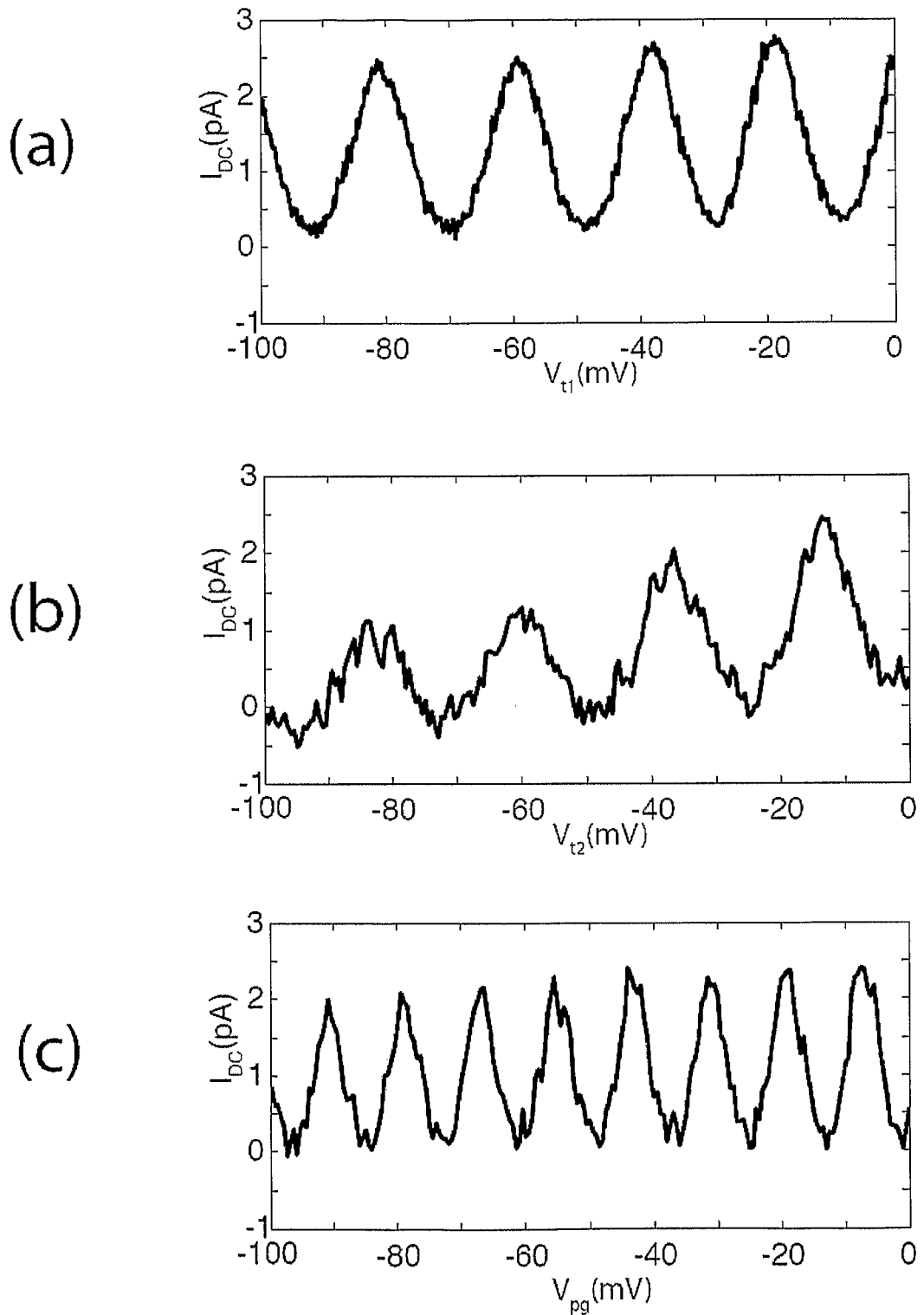
FIG. 6(a) is a graph of the current flow $I_{DC}$ with $V_{t1}$.
FIG. 6(b) is a graph of the current flow $I_{DC}$ with $V_{t2}$.
FIG. 6(c) is a graph of the current flow $I_{DC}$ with Vpg.

FIG. 5 is a STM image of the device 40. The bright areas denote the exposed resist where phosphine can attach and form a conductive δ-layer. The dot area is equivalent to ~40 nm×~50 nm. The separation between the two tunnelling junctions is ~150 nm. The distance from the dot to the plunger gate is ~36 nm. The distance between the tunnel junctions to the barrier gates is ~18 nm, and the width of the tunnel barriers is 8 nm. The width of the barrier-leads is ~3-4 nm, and can be seen to comprise about five dimer rows.

A significant feature of the architecture of this device is that quantum dot, electrodes and gates are all in the same plane, and are fabricated on the central step-free terrace 20 of FIG. 1(g).

The performance of the device will be explained with reference to FIGS. 6, 7, 8 and 9. One important aspect of these results is that the very narrow doped silicon gate leads are shown to conduct. This is possible because they are encapsulated in pure silicon by the epitaxial process.

The electron number N on the dot is tuned using each of the gates t1, t2 and PG in turn at 4.2 K. This leads to the well known Coulomb blockade oscillations in the current flow from source to drain.

FIG. 6(a) is a graph of the current flow $I_{DC}$ as a function of $V_{t1}$.

FIG. 6(b) is a graph of the current flow $I_{DC}$ as a function of $V_{t2}$.

FIG. 6(c) is a graph of the current flow $I_{DC}$ as a function of Vpg.

The graphs show that the measurements are stable at this temperature and the graphs agree with the theoretical results. Specifically the period of the oscillations reflects the separation of the gate electrodes from the central dot area and thus confirms accurate functionality of the device as expected from the donor pattern.

Figure 7:
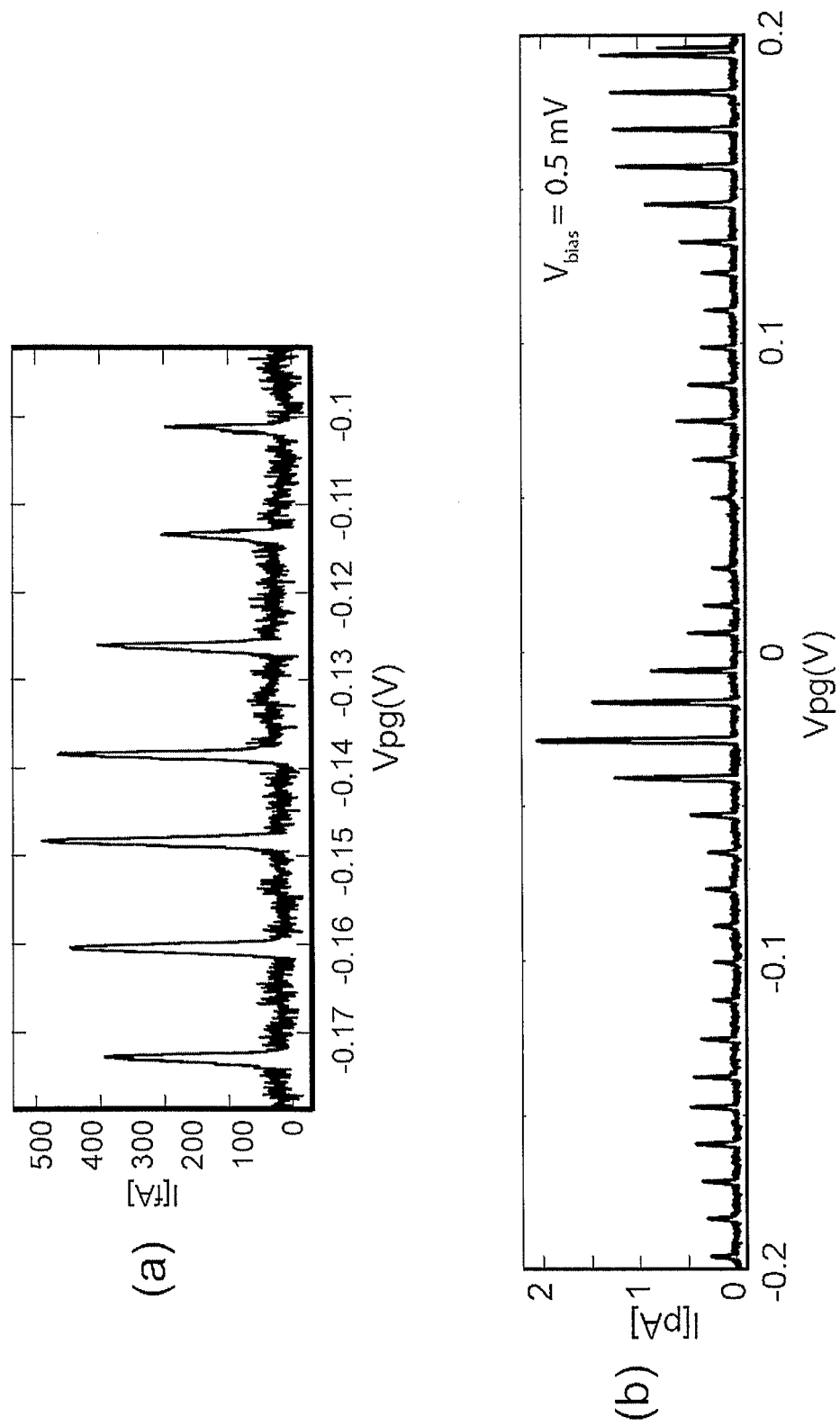
FIG. 7(a) is graph of the current flow through the device from Vsource to Vdrain for different Vpg.
FIG. 7(b) is another graph of the current flow with Vpg with a bias voltage of 0.5 mv.
Figure 9:
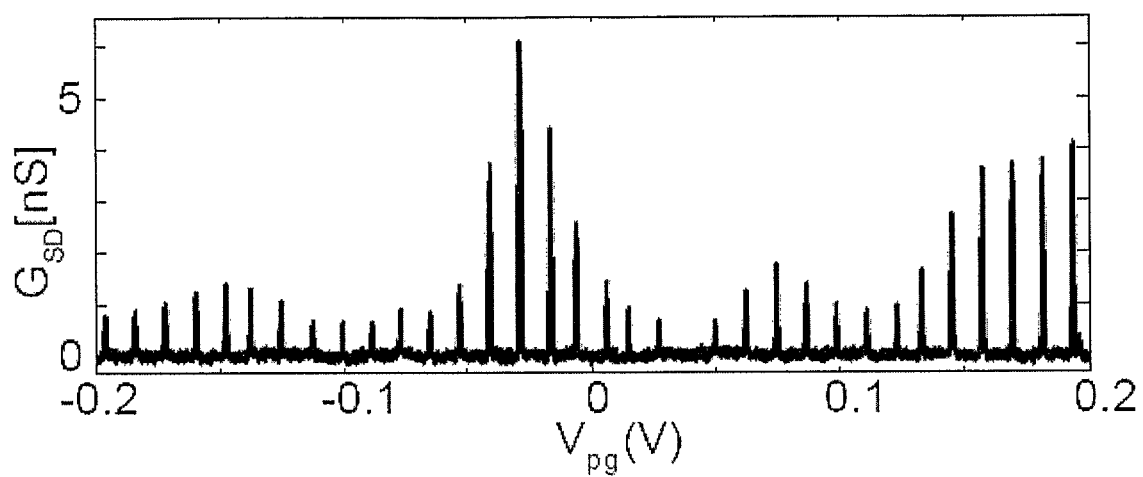
FIG. 9 is a graph of conductance at 0.1 K.

The graphs of the current flow shown in FIGS. 7 and 9 and measured at 0.1 K reveal high stability of the device over a large change of electron number.

Figure 8:
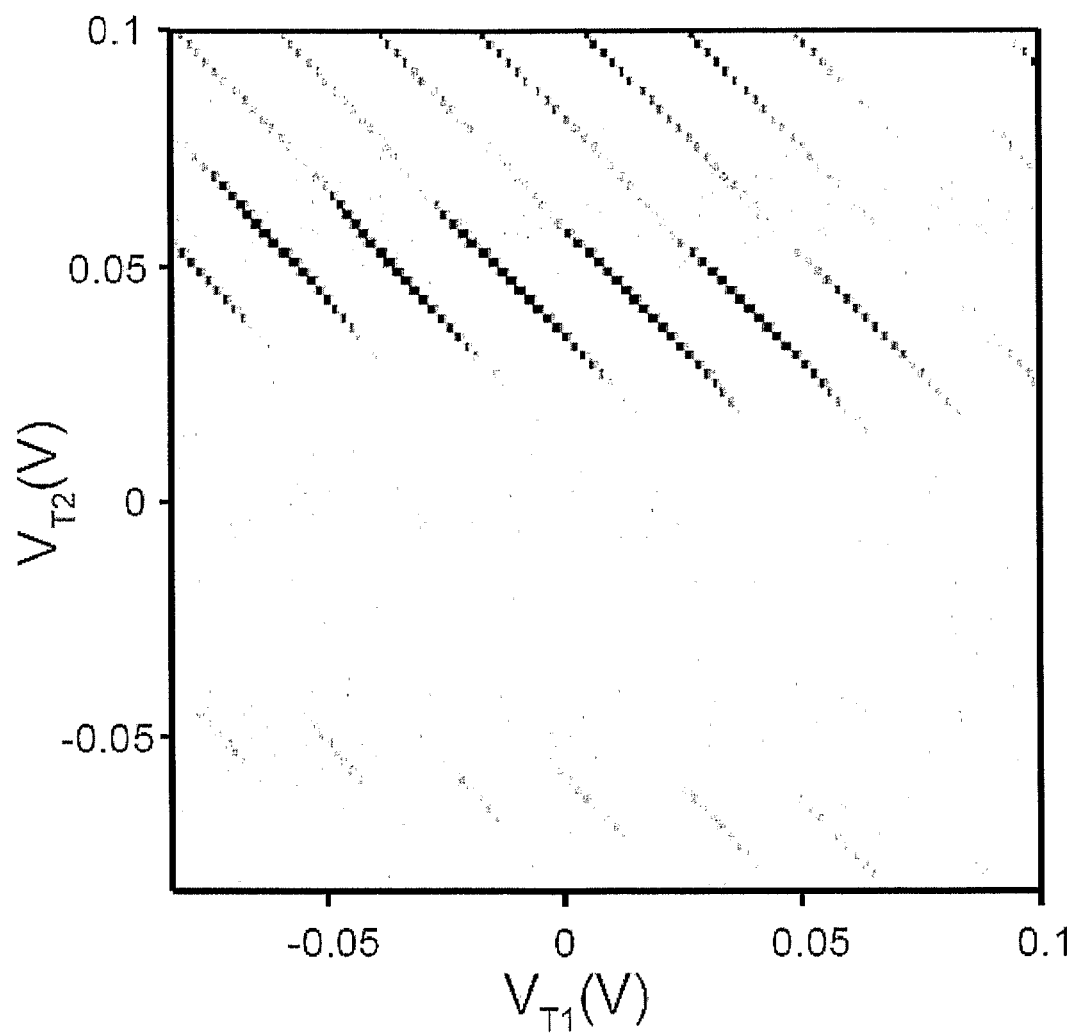
FIG. 8 is a greyscale plot of device conductance with variations in both $V_{t1}$ and $V_{t2}$

The FIG. 8 graph shows low temperature conductance measurements of Coulomb blockade oscillations at 0.1K as a function of the voltage applied to the two barrier gates 50 and 52. The nearly identical behaviour of the two gates is expected from the geometry and demonstrates correspondence between the STM pattern and the device. In addition, these measurements take several hours and thus again highlight the stability of the device.

Device Visibility Out of the UHV Environment

The completed device of FIG. 1 is imaged by STM after encapsulation in FIG. 1(m). In this image of an overgrown Si:P device the boundary between a doped area and the intrinsic substrate is visible and can be used for subsequent registration; the boundary indicated by dotted line. STM roughness analysis of the encapsulation layer shows slightly different surface roughness over the P-doped area, and this is understood to be the reason for the visibility of the device under STM.

Figure 10:
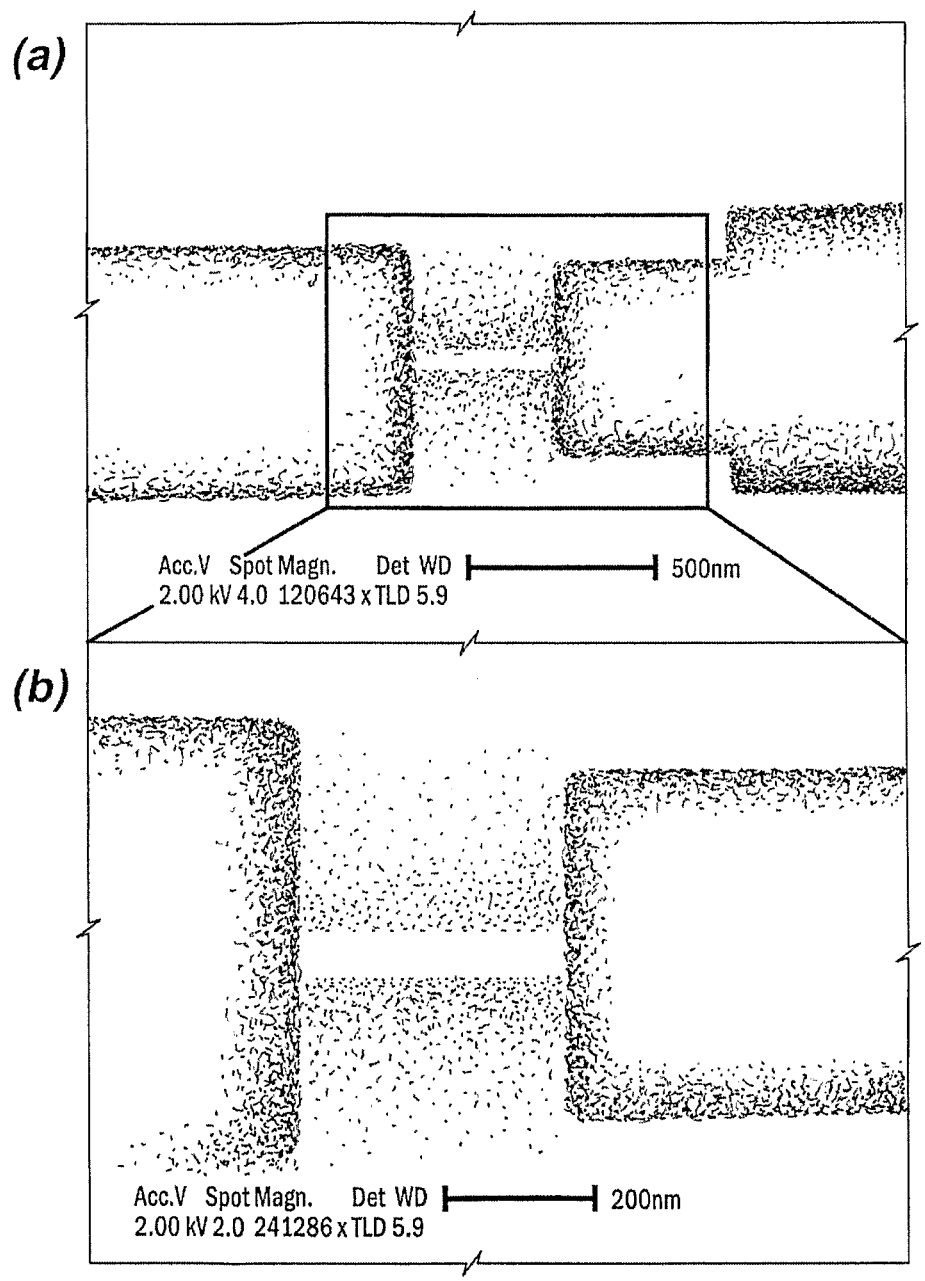
FIG. 10(a) is an ex-situ SEM image of the encapsulated device of FIG. 1(m) showing how the buried STM patterned layer is visible after encapsulation and removal from the ultra-high vacuum system.
FIG. 10(b) is an enlargement of FIG. 6(a).

What is surprising is that after the device is removed from the UHV environment a SEM image of the encapsulated device also shows the boundary between the doped and undoped regions. In FIG. 10(a) the P-doped regions are clearly visible as pale rectangular patches. The intermittent line (hardly visible) connecting the two big patches is only 50 nm wide and can still be resolved. The contrast increases for lower electron beam energies, suggesting a surface effect. The P-free regions appear more grainy indicating a different roughness is allowing the visibility. FIG. 10(b) is an enlargement of part of (a). The contrast of the overgrown device strongly depends on the imaging conditions. Generally, a lower electron beam energy will result in higher contrast. Using an in-lens detector for secondary electrons, we found that a beam energy of 2 kV yields the best images.

Connection to the Chip Surface

Figure 11:
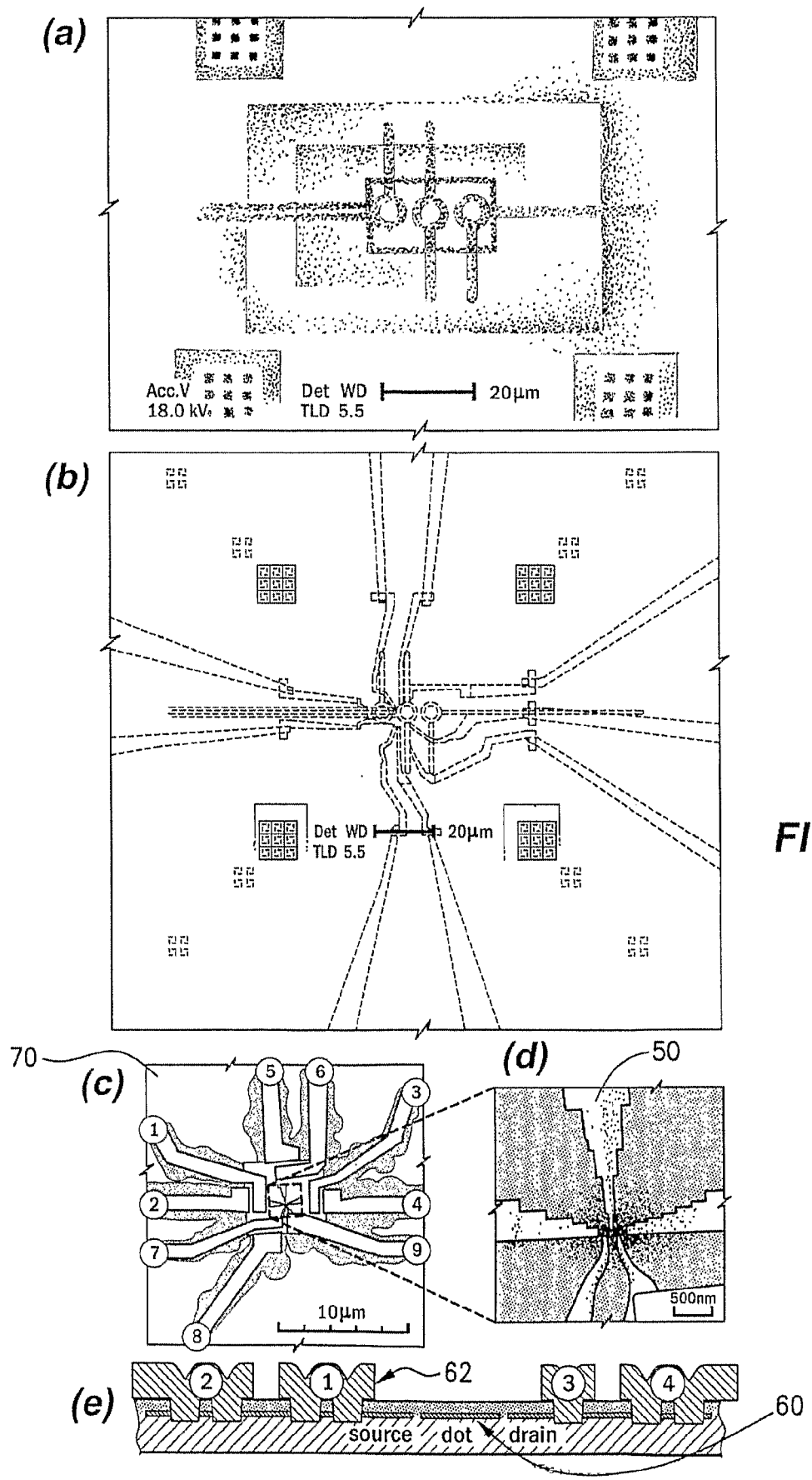
FIG. 11(a) is a SEM image of the buried dopant layer after silicon encapsulation but before surface contact alignment, where the dark region around the central terrace demonstrates the contrast of the buried donor layer.
FIG. 11(b) shows the import of this image into the NPGS software used to control EBL patterning to ensure overlap between the buried donor layer and the surface contact pattern.
FIG. 11(c) is a composite SEM image of metallic ohmic contacts with the device of FIG. 11(d) in the middle.
FIG. 11(d) is a SEM image of ohmic gate and contact leads with the device of FIG. 5 in the middle.
FIG. 11(e) is a cross section through FIG. 11(d) showing the regions of P donors and etched holes for metallic ohmic contacts.

Referring to the quantum dot device example, the ex-situ alignment and patterning process of contacts and gates after the sample has been removed from UHV is illustrated in FIG. 11. Part (a) of the figure is a composite image from high resolution SEM images of different areas of the device chip. The array of 3×3 square marker structures defines the alignment markers during EBL patterning of the ohmic contacts. In the centre of FIG. 11(a), several shallow marker structures such as lines and the aforementioned circles can be seen. Most importantly, the five encapsulated ohmic leads to the gates 50 of the quantum dot device of FIG. 5 are clearly visible despite being buried under a 25 nm epitaxial Si encapsulation layer. The visibility of these leads allows for the deposition of surface contacts in appropriate locations and their subsequent connection to the gate leads.

FIG. 11(b) is a composite image illustrating the actual alignment process during EBL patterning of the ohmic contacts. The dashed lines represent the contact structures within the CAD software of our EBL patterning generator NPGS. In the centre, the SEM image of part (a) is overlayed which is used to directly align the ex-situ ohmic leads to the image of the buried device. The alignment accuracy is limited by the imaging resolution of the encapsulated device. We are able to pattern contacts and top-gates with a sub-100 nm accuracy.

FIG. 11(c) shows the same device after deposition of metallic ohmic contacts (numbered) that have been aligned ex-situ using SEM techniques to the atomic scale device. FIG. 11(d) is a close-up of the five STM-patterned ohmic leads of the same quantum dot device after metal deposition (note the images of FIG. 11(c) and (d) have been inverted with respect to FIG. 5). The capability to image the buried P-doped structure even after patterning of ohmic contacts and a contact anneal allows for precise process control and non-destructive verification of alignment accuracy.

FIG. 11(e) is a schematic cross-section of the final device showing the buried layer of P donors 60 and the ohmic contacts 62. Interestingly, if a metallic topgate is patterned on the native $SiO_2$ barrier over the encapsulated quantum dot device the low temperature conductance peak measurements at 0.1 K reveal higher instability.

Figure 12:
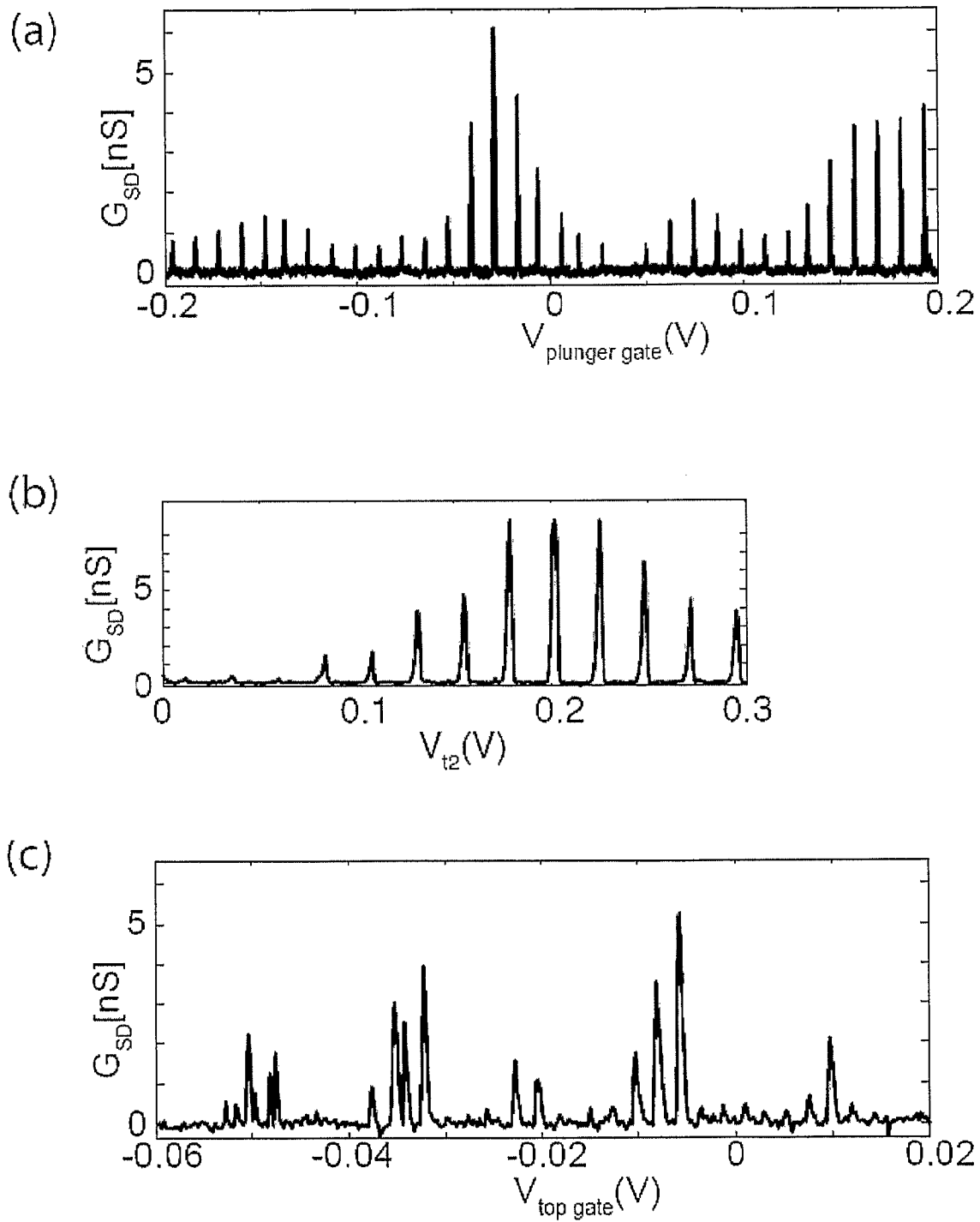
FIG. 12(a) Coulomb blockade oscillations as a function of plunger gate voltage at a temperature of 100 mK.
FIG. 12(b) Coulomb blockade oscillations as a function of barrier gate voltage $V_{t2}$ at a temperature of 100 mK.
FIG. 12(c) Coulomb blockade oscillations as a function of the voltage applied to a metallic top gate, which shows considerably less stable behavior.

FIG. 12 shows a comparison of Coulomb blockade oscillations using the same conditions but tuning the electron number with different gates. While the traces in FIGS. 12(a) and 12(b) are highly reproducible and stable, the trace in FIG. 12(c) shows much more noise and peak positions shift, indicating that the electron number on the dot is influenced by movement of charge e.g. at the interface between the metallic gate and the buried donor device. This highlights another advantage of using gates in the plane of the active device rather than metallic top gates.

Going back to FIG. 11, connection between the ohmic gate leads 50 and the metallic surface gates and contracts 62 is achieved by etching an array of small holes 70, between 10 and 500 nm in diameter above the gate leads, using the SEM to align the holes. Metallisation of lithographically patterned contacts over these holes makes good electrical contact to the buried dopant structure. These arrays of holes can be seen in FIG. 11(b) and one of the benefits of this technique is that misaligned holes do not cause a problem provided the architecture does not bridge between two gates in the same layer.

This requirement imposes a minimum distance between the edges of the gates on each layer. These holes allow the surface metal contact to align directly with the buried device. This means that it is not necessary to anneal the surface metal to achieve good electrical contact to the buried layer. After the initial incorporation anneal of the dopants to activate them the device no longer sees temperatures above ~250° C.

Mass Production

The SEM image of FIG. 11(a) can be scanned and used to construct a software control program for the STM patterning of the buried dopant structure and SEM patterning of ohmic contacts and gates. The use of these techniques allows us to pattern contacts to multiple STM patterned devices with inter device spacings down to ~20 nm.

The following references are incorporated herein by reference:

1. J. W. Lyding, T.-C. Shen, J. S. Hubacek, J. R. Tucker, and G. C. Abeln, Appl. Phys. Lett. 64, 2010 (1994).
2. T. C. Shen, J. S. Kline, T. Schenkel, S. J. Robinson, J.-Y. Ji, C. Yang, R.-R. Du, and J. R. Tucker, J. Vac. Sci. Technol. B 22, 3182 (2004).
3. F. J. Rueβ, L. Oberbeck, K. E. J. Goh, M. J. Butcher, E. Gauja, A. R. Hamilton, and M. Y. Simmons, Nanotechnology 16, 2446 (2005).
4. F. J. Rueβ et al., Small 3, 563 (2007).
5. F. J. RueBβ, L. Oberbeck, M. Y. Simmons, K. E. J. Goh, A. R. Hamilton, T. Hallam, N. J. Curson, and R. G. Clark, Nano Lett. 4, 1969 (2004).
6. F. J. Rueβ, K. E. J. Goh, M. J. Butcher, T. C. G. Reusch, L. Oberbeck, B. Weber, A. R. Hamilton, and M. Y. Simmons, Nanotechnology 18, 044023 (2007).
7. W. Pok, T. C. G. Reusch, G. Scappucci, F. J. Rueβ, A. R. Hamilton, and M. Y. Simmons, IEEE Trans. Nanotechnol. 6, 231 (2007).
8. F. J. Rueβ, W. Pok, K. E. J. Goh, A. R. Hamilton, and M. Y. Simmons, Phys. Rev.
9. S. Tanaka, C. C. Umbach, J. M. Blakely, R. M. Tromp, and M. Mankos, Appl. Phys. Lett. 69, 1235 (1996).
10. D. Lee and J. Blakely, Surf. Sci. 445, 32 (2000).
11. Y. Homma, N. Aizawa, and T. Ogino, Jpn. J. Appl. Phys., Part 2 35, L241 996).
12. K.-C. Chang and J. M. Blakely, Surf. Sci. 591, 133 (2005).
13. T. Ohmi, K. Kotani, A. Teramoto, and M. Miyashita, IEEE Electron Device Lett. 12, 652 (1991).
14. B. Koiller, X. Hu, and S. Das Sarma, Phys. Rev. B 66, 115201 (2002).
15. O. Tabata, R. Asahi, H. Funabshi, K. Shimaoka, and S. Sugiyama, Sens. Actuators, A A34, 51 (1992).
16. M. E. Keeffe, C. C. Umbach, and J. M. Blakely, J. Phys. Chem. Solids 55, 965 (1994).
17. S. R. Schofield, N. J. Curson, M. Y. Simmons, F. J. Rueβ, T. Hallam, L. Oberbeck, and R. G. Clark, Phys. Rev. Lett. 91, 136104 (2003).
18. L. Oberbeck, N. J. Curson, T. Hallam, M. Y. Simmons, G. Bilger, and R. G. Clark, Appl. Phys. Lett. 85, 1359 (2004).
19. See, for example, C. W. J. Beenakker and H. van Houten, Solid State Phys. (Tokyo) 44, 1 (1991).
20. S. Hikami, A. I. Larkin, and Y. Nagaoka, Prog. Theor. Phys. 63, 707 (1980).
21. A. Moel, E. E. Moon, R. Frankel, and H. I. Smith, J. Vac. Sci. Technol. B 11, 2191 (1993).
22. P. Zhang et al., Nature (London) 439, 703 (2006).

Although the invention has been described with reference to a particular example, it should be appreciated that it could be exemplified in many other forms and in combination with other features not mentioned above. For instance, we are currently investigating ways to improve this alignment accuracy by incorporating advanced marker structures such as Moiré-type gratings[21] into the described alignment scheme. In parallel, we are investigating low temperature 900° C. surface preparation techniques[22] which would drastically reduce the loss of integrity of the etched marker structures.

The invention claimed is:

1. A method for fabricating atomic scale multi-terminal electronic devices, comprising the steps of:
    opening one or more regions of a mask on a semiconductor surface using a scanning tunnelling microscope (STM) tip capable of atomic precision or a scanning electron microscope (SEM) capable of micro-nano precision;
    treating the regions to form coplanar components of the device on the semiconductor surface;
    encapsulating the components of the device with more semiconductors;
    imaging the components of the device encapsulated below the surface using an optical or electron microscope to identify locations on the surface of the encapsulated device that are above selected components of the device encapsulated below the surface;
    forming conducting elements on the surface of the encapsulated device at the identified locations; and,
    electrically connecting conducting elements on the surface of the encapsulated device with aligned components of the device encapsulated below the surface.

2. A method for fabricating atomic scale multi-terminal electronic devices according to claim 1, wherein the components of the device are made electrically active before the fabricating steps are completed.

3. A method for fabricating atomic scale multi-terminal electronic devices according to claim 2, wherein the electrically active components of the device include ohmic contacts for electrical connection to the device, or one or more gates for device tunability, or both.

4. A method for fabricating atomic scale multi-terminal electronic devices according to claim 1, comprising the further step of imaging the edges of the buried electrically active components of the device encapsulated below the surface ex-situ using an optical microscope.

5. A method for fabricating atomic scale multi-terminal electronic devices according to claim 1, comprising the further step of imaging the edges of the buried electrically active components of the device encapsulated below the surface ex-situ using an electron microscope.

6. A method for fabricating atomic scale multi-terminal electronic devices according to claim 5, wherein the electron microscope is a scanning electron microscope (SEM).

7. A method for fabricating atomic scale multi-terminal electronic devices according to claim 1, wherein the opening step is performed in a single operation of the STM tip.

8. A method for fabricating atomic scale multi-terminal electronic devices according to claim 1, wherein the step of encapsulating the electrically active components of the device with semiconductor, involves encapsulating to a thickness where at least an indication of the position of some of the edges of the electrically active components of the device are visible ex situ using a SEM or optical microscope.

9. A method for fabricating atomic scale multi-terminal electronic devices according to claim 8, wherein the step of forming conducting elements involves directing the deposition of an electrical conducting element onto the surface of the encapsulation to the identified locations under the supervision of SEM or optical techniques.

10. A method for fabricating atomic scale multi-terminal electronic devices according to claim 8, wherein the semiconductor is silicon and the step of encapsulating comprises overgrowing with an epitaxial silicon layer to create crystalline silicon above the device to a thickness of between 5 to several hundred nm.

11. A method for fabricating atomic scale multi-terminal electronic devices according to claim 1, wherein the electrically conducting elements on the surface include contacts and gates patterned using optical or SEM and EBL techniques.

12. A method for fabricating atomic scale multi-terminal electronic devices according to claim 11, wherein the electrically connecting step involves using SEM and EBL techniques to etch one or more holes, between 10 and 500 nm in diameter, through the encapsulation down to, at least, the device layer.

13. A method for fabricating atomic scale multi-terminal electronic devices according to claim 12, comprising the further step of depositing metallisation over the one or more holes.

14. A method for fabricating atomic scale multi-terminal electronic devices according to claim 1, comprising the further step of cloning the entire device in multiple instances either laterally or in multiple vertical layers.

15. A method for fabricating atomic scale multi-terminal electronic devices according to claim 14, wherein the clones are located next to each other with a pitch of down to 20 nm.

16. A method for fabricating atomic scale multi-terminal electronic devices according to claim 1, comprising the further step of building a second different device either displaced laterally with respect to, or on top of, a first device.

17. A method for fabricating atomic scale multi-terminal electronic devices according to claim 16, wherein multiple different devices are located next to each other with a pitch of down to 20 nm.

18. A method for fabricating atomic scale multi-terminal electronic devices according to claim 1, comprising the further step of prepatterning the semiconductor substrate to leave a formation visible using STM, SEM or an optical microscope, before or after encapsulation.

19. A method for fabricating atomic scale multi-terminal electronic devices according to claim 18, wherein the formation is a ring boundary with a step-free, atomically flat, plane within the boundary.

20. A method for fabricating atomic scale multi-terminal electronic devices according to claim 19, wherein the ring boundary is a circular trench boundary between 50 nm and 200 nm deep around an atomically flat plane up to several microns in diameter.

21. A method for fabricating atomic scale multi-terminal electronic devices according to claim 18, comprising the further step of prepatterning micron sized markers to assist with locating and navigating the STM.

22. A method for fabricating atomic scale multi-terminal electronic devices according to claim 1, comprising the further step of repeating the opening and treating steps as necessary until all the electrically active parts of the device are formed on the surface.

* * * * *